(12) United States Patent
Lahreche et al.

(10) Patent No.: US 7,488,385 B2
(45) Date of Patent: Feb. 10, 2009

(54) METHOD FOR EPITAXIAL GROWTH OF A GALLIUM NITRIDE FILM SEPARATED FROM ITS SUBSTRATE

(75) Inventors: Hacène Lahreche, Paris (FR); Gilles Nataf, Golfe Juan (FR); Bernard Beaumont, Valbonne (FR)

(73) Assignee: Lumilog, Vallauris (FR)

( * ) Notice: Subject to any disclaimer, the term of this patent is extended or adjusted under 35 U.S.C. 154(b) by 282 days.

(21) Appl. No.: 10/516,358

(22) PCT Filed: May 28, 2003

(86) PCT No.: PCT/FR03/01615

§ 371 (c)(1), (2), (4) Date: Nov. 24, 2004

(87) PCT Pub. No.: WO03/100839

PCT Pub. Date: Dec. 4, 2003

(65) Prior Publication Data

US 2005/0217565 A1 Oct. 6, 2005

(30) Foreign Application Priority Data

May 28, 2002 (FR) .................................. 02 06486

(51) Int. Cl.
*C30B 25/02* (2006.01)
(52) U.S. Cl. ............................. 117/84; 117/88; 117/91; 117/94; 117/95; 117/99; 117/915; 117/952
(58) Field of Classification Search .................. 117/84, 117/88, 91, 94, 95, 97, 99, 915, 952
See application file for complete search history.

(56) References Cited

U.S. PATENT DOCUMENTS

| 6,303,405 | B1 * | 10/2001 | Yoshida et al. ................. 438/46 |
| 6,325,850 | B1 * | 12/2001 | Beaumont et al. ............. 117/95 |
| 6,355,497 | B1 | 3/2002 | Romano et al. |
| 6,380,108 | B1 | 4/2002 | Linthicum et al. |
| 6,723,165 | B2 * | 4/2004 | Ogawa et al. .................. 117/95 |
| 2003/0064535 | A1 * | 4/2003 | Kub et al. ...................... 438/22 |
| 2003/0077885 | A1 * | 4/2003 | Aspar et al. .................. 438/517 |

FOREIGN PATENT DOCUMENTS

| EP | 1 041 610 A1 | 10/2000 |
| WO | WO 0193325 A1 * | 12/2001 |
| WO | WO 02/43112 A2 | 5/2002 |

* cited by examiner

*Primary Examiner*—Robert M Kunemund
*Assistant Examiner*—Matthew J Song
(74) *Attorney, Agent, or Firm*—Blakely, Sokoloff, Taylor & Zafman LLP

(57) ABSTRACT

The invention concerns the preparation of gallium nitride films by epitaxy with reduced defect density levels. It concerns a method for producing a gallium nitride (GaN) film by epitaxial deposition of GaN. The invention is characterized in that it comprises at least a step of epitaxial lateral overgrowth and in that it comprises a step which consists in separating part of the GaN layer from its substrate by embrittlement through direct ion implantation in the GaN substrate. The invention also concerns the films obtainable by said method as well as the optoelectronic and electronic components provided with said gallium nitride films.

15 Claims, 3 Drawing Sheets

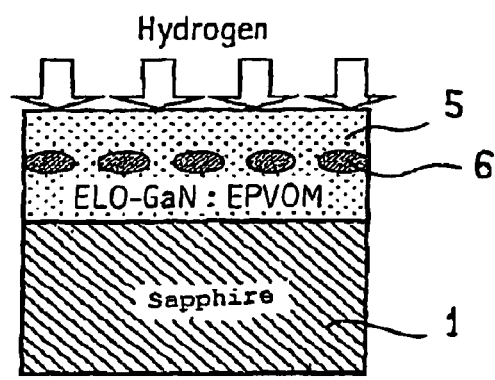
FIG.3
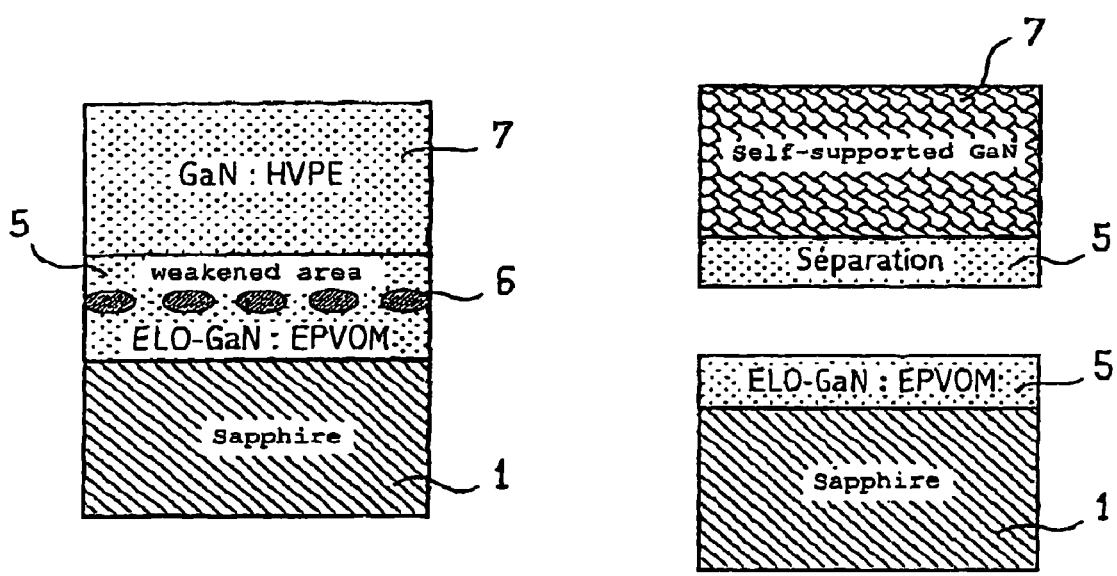
FIG.4
FIG.5

METHOD FOR EPITAXIAL GROWTH OF A GALLIUM NITRIDE FILM SEPARATED FROM ITS SUBSTRATE

The present application is a non-provisional application of International application Ser. No. PCT/FR2003/001615, filed May 28, 2003.

The present invention concerns the production of films of gallium nitride (GaN) by epitaxy with reduced defect densities.

It also concerns the optoelectronic and electronic components provided with such gallium nitride films.

At the end of 1995, the company Nichia produced a laser diode using III-V nitrides. Such a result showed that it was possible to obtain a laser emission in a heteroepitaxial structure where the density of dislocations attained $10^8$ to $10^{10}$ cm$^{-2}$. At the end of 1997, Nichia demonstrated that it was possible to obtain a laser emission for 10,000 hours provided that the structure is provided with a layer of GaN of good quality. It was a case of layers of GaN produced according to ELO (Epitaxial Lateral Overgrowth) technology.

Although it has long been stated that the dislocations in GaN did not act as non-radiative recombination centres, it is established that in fact certain screw-component dislocations introduce non-radiative centres and that the performances are much superior on a structure with better crystallographic quality. Thus the life of laser diodes based on III-V nitride depends critically on the density of dislocation in the layers of GaN with which they are provided.

All current efforts are converging towards the obtaining of heteroepitaxiated GaN with the best crystalline quality. This is why the lateral epitaxy technique (ELO) has been widely developed for GaN with many variants.

As films of GaN available with a satisfactory surface and in sufficient quantity do not exist, components based on III-V nitride are produced by heteroepitaxy on substrates such as sapphire, SiC, Si or the like. The sapphire commonly used as a substrate does not have a cutting plane, which means that, in a laser diode structure based on epitaxiated GaN on sapphire, it is difficult to manufacture reflective facets.

Moreover, the use of a substrate such as sapphire having both a lattice parameter mismatch and a thermal expansion coefficient mismatch is responsible for the very high density of dislocation in heteroepitaxial GaN/sapphire layers.

Various epitaxial lateral overgrowth technologies have been developed for the use of ELO, HVPE (Hybrid Vapour Phase Epitaxy or vapour phase epitaxy using halides and hydrides), EPVOM (vapour phase epitaxy by pyrolysis of organometallics) and even by sublimation (CSVT, standing for Close Space Vapour Transport). All make it possible to obtain layers of GaN with dislocation densities below $10^7$ cm$^{-2}$ compared with $10^8$ to $10^{10}$ with standard technology. However, and this is inherent in the technology employed, there remain areas where the density of dislocation remains high, above openings and coalescence joints in a technology with an epitaxy step, at the coalescence joints and at the middle of the openings in a two-step technology, where during a first step deposition by epitaxy of GaN is carried out in the openings after having masked and etched, in particular by photolithography, a dielectric layer in order to form these said openings and during a second step of epitaxial lateral overgrowth (ELO) the lateral growth of patterns of GaN first of all deposited is proceeded with and continued until their coalescence.

A known variant of the growth technology is based on vapour phase epitaxy by pyrolysis of organometallics (EPVOM) according to a process which is now well established (on sapphire): treatment of the surface of the sapphire, low-temperature nucleation of a layer of GaN or AlN, annealing up to the final growth temperature of this nucleation layer and high-temperature growth of GaN (1000-1100° C.). Several technologies have been developed in order best to optimise this heteroepitaxy and limit to approximately $5 \times 10^8$ cm$^{-2}$ the density of dislocations in GaN in particular; P. Vennéguès et al, J. Cryst. Growth, 187, 167 (1998); S. Figge et al, J. Cryst. Growth, 221, 262 (2000).

On SiC, the low-temperature nucleation layer is no longer necessary; first of all a layer of AlN is produced at high temperature before the deposition of GaN. However, the density of dislocations remains substantially around approximately $5 \times 10^8$ cm$^{-2}$.

Whatever the technology, the density of the extended defects: dislocations, stacking faults, inversion domains or nanotubes, attains $5.10^8$ cm$^{-2}$. The dislocations propagate in the direction of growth and emerge on the surface, where they can be identified by atomic force microscopy (AFM) or cathodoluminescence (CL). These dislocations are harmful from several points of view. First of all, in high density (above $5 \times 10^8$ cm$^{-2}$), the defects degrade the electron mobility as well as the optoelectronic properties (intensity of photoluminescence, life of carriers). In addition, the emergence of dislocations on the surface results in a depression on the surface (Heying et al., J. Appl. Phys., 85, 6470, 1999). In a laser diode structure based on GaInN multiple quantum wells (MQWs), the dislocations interfere with the sequencing of the MQWs and cause non-homogeneous light emission. Finally, the metals used for the ohmic contacts can also diffuse through these dislocations and nanotubes.

Thus, as disclosed above, epitaxial lateral overgrowth (ELO), with many variants, constitutes one of the most pertinent methods for reducing the density of dislocations by several orders of magnitude, that is to say below approximately $10^7$ cm$^{-2}$.

However, this method has other drawbacks, in particular for ELO quality GaN/sapphire layers. This is because, the substrate being sapphire, cutting the facets remains very difficult. In addition, there remain, in the layers of GaN obtained by ELO, lines with high defect density corresponding to the coalescence joints, on which it is not recommended to produce a component, which reduces the surface available for the manufacture of optoelectronic components.

The ideal solution would thus be to dispose GaN of high crystalline quality with a diameter of 50.8 mm (2 inches) as is the case with the majority of semiconductors.

It is impossible to deal with these drawbacks and to obtain a monocrystal by fusion meeting this diameter criterion, because of the physical and chemical properties of GaN. This is because GaN monocrystals can be obtained by growth in solution at high temperature (1800 K) under hydrostatic pressure (1.5 GPa). However, although of very good crystalline quality (density of dislocation less than $10^4$ cm$^{-2}$) the surface of these crystals does not exceed 1 cm$^2$ and the production method does not make it possible to deal with worldwide requirements.

Moreover, when HVPE technology is used for producing a layer of GaN, the drawback remains that the density of dislocations is situated around $10^7$ cm$^{-2}$. More precisely, a very thick layer (approximately 500 μm) is produced on sapphire, avoiding the formation of cracks. For thicknesses of this order, the density of dislocation decreases until around $10^7$ cm$^{-3}$. Then the substrate is separated either by mechanical abrasion or by laser separation (LLO).

In order to obtain a film of GaN separate from its substrate which is of good quality, that is to say with a density of dislocations below $10^7$ cm$^2$, over a diameter of at least 50.8 mm (2 inches), it is necessary first of all to use ELO technology, then to separate the layer of GaN formed from its original substrate, and next to rethicken the layer of GaN, or to reuse the ELO GaN layer thus separated for a new growth.

The substrate can be separated by chemical method according to the technique disclosed in EP 1 041 610, in particular if the substrate is chosen from amongst Si, NdGaO$_3$ or GaAs. This technique makes it possible to obtain a film of GaN separate from its substrate, of good quality. This technique is not applicable to a sapphire substrate, which is chemically inert. Only laser ablation currently makes it possible to separate GaN from its sapphire substrate (LLO). This technique, as described in WO 98/14986, is based on the use of a pulsed UV laser emission which passes through the sapphire but which is absorbed at the GaN, causing local thermal decomposition of GaN at the interface.

However, there exists a need to have available alternative techniques for obtaining films of GaN separate from their substrate, 50.8 mm in diameter and of ELO quality, even if the existing techniques (LLO, sacrificial layer, abrasion) give good results.

It is also known from the patent application EP 533 551 that it is possible to manufacture thin films of semiconductor materials according to the following process:

In a first step, ions are implanted by bombardment, creating in the semiconductor, at a depth around the mean depth of penetration of these ions, a layer of microcavities (or bubbles). In a second step, a heat treatment of the semiconductor thus implanted produces a rearrangement of the structure, and the pressure caused by the microbubbles allows separation of a thin film from the rest of the semiconductor.

However, this technique, known as "smart cut", has never been used for GaN.

The aim of the invention is to propose a method of producing a film of GaN separate from its substrate which is simple, rapid and inexpensive, and which provides a film of GaN of increased quality.

In the context of the present invention, the GaN may be doped or not. By way of doping substances it is possible in particular to cite magnesium, zinc, beryllium, calcium, carbon, boron and silicon.

In the following description the term "film of GaN separate from its substrate" or "self-supported film of GaN" are employed-independently.

Thus the object of the invention is a method of producing a self-supported film of gallium nitride (GaN) from a substrate, by the deposition of GaN by epitaxy, characterised in that the deposition of GaN comprises at least one step of epitaxial lateral overgrowth (ELO) and in that it includes a step of separating part of the layer of GaN from its substrate by weakening by ion implantation in the layer of GaN directly.

More particularly the invention concerns a method of producing a film of gallium nitride (GaN) as described above, characterised in that it comprises the following successive steps:

(i) the deposition of a layer of GaN on a substrate by vapour or liquid phase epitaxy,
(ii) a weakening ion implantation step so as to create a weak area in the layer of GaN deposited during the previous step,
(iii) a step of resumption by epitaxial lateral overgrowth (ELO) in order to form a new layer of GaN and
(iv) a spontaneous separation step at the weak area.

The GaN epitaxial lateral overgrowth steps can be carried out in vapour phase, for example by virtue of EPVOM, HVPE or SVT or liquid (LPE) techniques.

This method makes it possible in particular to place the weak area in a precisely desired area because the GaN deposited during the epitaxy reworking does not interfere with the ion implantation. This method also makes it possible to use the high temperatures of the epitaxial reworking as being the heat treatment useful for ensuring the rearrangement of the structure. Finally, this method makes it possible to obtain spontaneous separation after the various epitaxy phases and heat treatments, namely from the resumption of growth up to the cooling at the end of the epitaxy reworking phase.

This method has in particular the advantage of not requiring high doses of ion implantation but also providing films of GaN of even and controlled thickness, namely in particular very fine, around 0.1 μm.

The invention also concerns any film of GaN able to be obtained by this method. The film of GaN thus obtained can have a thickness varying from 100 to 5000 μm. According to a particular embodiment of the invention, the film of GaN obtained can have a thickness of at least 0.1 mm.

The thickness range which can be aimed at is therefore very wide.

For a large number of applications, it is sought to manufacture films of gallium nitride having a thickness of more than 50 μm; these films form part of the invention.

An optoelectronic component is also proposed, and in particular a laser diode, a UV light-emitting diode, a photodetector or a transistor, characterised in that it is provided with a film of GaN able to be obtained by the method of the invention.

The initial substrates can have a thickness of few hundreds of micrometres, generally around 200 μm, and can be chosen from amongst sapphire, ZnO, SiC, LiAlO$_2$, LiAlO$_2$, LiGaO$_2$, MgAlO$_4$, Si, GaAs, AlN or GaN. The substrates can be treated prior to any deposition of GaN by nitriding.

During the step of deposition on a substrate of a layer of GaN by vapour phase epitaxy (i), a vapour phase epitaxial lateral overgrowth (ELO) is preferentially carried out in order to minimise the defect density from the very start of the method of the invention. It is possible in particular to employ EPVOM, HVPE or CSVT technology. During this step it is preferred to use EPVOM technology.

The two alternatives described below both relate to ELO technology, the second alternative having recourse to a so-called "spontaneous ELO" technology, which was described in MRS Internet J. Nitride Semicond. Res. 7, 8 (2002).

Thus, according to a first alternative of the step of depositing a layer of GaN (i) on the substrate, there is first carried out, after having deposited a thin layer of GaN on the substrate, a deposition on the substrate of an appropriate dielectric, which is etched for example by photolithography, so as to define openings, secondly an exposure of the areas of the thin layer of GaN which are facing and lastly a deposition by epitaxy of GaN so as to induce the deposition of patterns of GaN on the facing areas and the anisotropic and lateral growth of the patterns, the lateral overgrowth being maintained until the various patterns coalesce. This first alternative in the ELO technique is known and in particular described in patent application WO99/20816. In particular the mask formation techniques are known to persons skilled in the art.

The dielectric mask used during step (i) can consist of silicon nitride (SiN), SiO$_2$ or W. The deposition of the dielectric is carried out according to techniques well known to persons skilled in the art.

In the context of this first alternative of step (i), the prior deposition of the thin layer of GaN (before the deposition of the dielectric by way of mask) can be preceded by the deposition of a nucleation layer by the formation of a very thin film of silicon nitride so as to obtain spontaneous patterns or islands of GaN. This possibility is disclosed in very detailed fashion in Example 1 and also in patent application WO99/20816.

According to a second alternative of the step of depositing on the substrate a layer of GaN (i), the step of etching a dielectric mask is eliminated by virtue of the spontaneous formation of patterns of GaN in the form of islands, fulfilling the same role. More precisely, this second alternative can be described as follows: the substrate is covered with a thickness of silicon nitride of around a few atomic planes, in other words around 10 nm to 20 nm thick. The deposition of SiN using silane and ammonia can last for 360 seconds instead of 30, and the layer of SiN thus formed is, as shown by the very high resolution electron microscopy analysis presented in the aforementioned article, discontinuous; a mask of SiN to a nanometric scale therefore forms spontaneously, which induces an ELO process. After completion of the formation of the layer of silicon nitride, a layer of GaN, referred to as a continuous buffer layer, is deposited. The thickness of this layer can be between 10 and 100 nm. The temperature during this operation can be between 500° and 700° C. Annealing at high temperature is then carried out, between 900° and 1150° C. The buffer layer is converted from a continuous layer to a discontinuous layer formed from patterns of GaN, or in other words patterns of GaN in the form of islands. The areas where the silicon nitride is bared then function as a mask and the GaN patterns function as areas of GaN located in the openings produced ex situ in the mask. A deposition by epitaxy of GaN is then carried out in the same way as in the previous alternative. This method, where the silicon nitride mask forms spontaneously and which involves the same mechanisms of curvature of the dislocations as in ELO, is identified as "spontaneous ELO".

The ion implantation during step (ii) can be implemented during a single step or successive steps. The implantation energies can vary from 80 to 160 keV. The ion implantations can be chosen from amongst $H^+$, rare gas ions such as helium, neon, krypton and xenon, as well as boron, which can be used alone or in combination. $H^+$ ions are preferred as implantation ions in the context of the present invention.

According to the invention, the temperature during the implantation can vary between 4 K and 1000 K. By way of example, this temperature can be maintained at ambient temperature during the $H^+$ ion implantation in a layer of GaN. The heat treatment temperature during which the crystalline rearrangement occurs, which corresponds to the temperature of the epitaxy, can vary from 900° to 1150° C.

In terms of implantation ion dose, when this is the $H^+$ ion, the dose is preferably situated between $10^{16}$ and $10^{17}$ $H^+$ ions $cm^{-2}$. The implantation depth varies from 50 nm starting from the free surface as far as the GaN/initial substrate interface.

When step (i) of the method is implemented according to the second variant described above, the implantation can be effected at various stages of the growth, either in the islands, or at an intermediate stage where the islands are not entirely coalesced, or after total coalescence.

The step of reworking by epitaxy (iii) can be implemented by EPVOM, HVPE, CSVT or LPE (liquid phase epitaxy). During this step it is preferred to use HVPE technology.

The spontaneous separation in step (iv) takes place because of the thermal cycle (resumption of epitaxy at high temperature and cooling) undergone by the layer of ELO GaN during step (iii) after implantation. The ratio of thicknesses of the layer and of the substrate can preferably be greater than 0.5 for spontaneous separation.

Other characteristics, aims and advantages of the invention will emerge from a reading of the following detailed description of a particular embodiment of the invention made with reference to FIGS. 1 to 5, in which:

FIG. 3 is a representation of a step of implantation of $H^+$ ions in an ELO layer;

FIG. 4 is a representation of a step of HVPE epitaxial resumption;

FIG. 5 is a representation of a step of spontaneous separation of an ELO layer.

The obtaining of self-supported GaN takes place, according to this particular embodiment of the invention, in three steps:

The first step consists of a growth of GaN by epitaxial lateral overgrowth on a sapphire substrate by EPVOM;

The second step consists of a hydrogen implantation;

The third step consists of a resumption of HVPE epitaxy.

Figure 1:
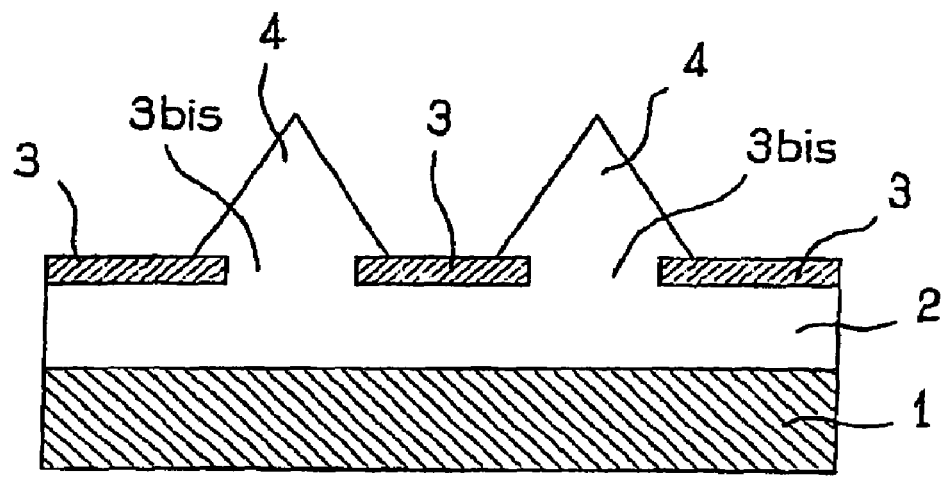
FIG. 1 is a representation of a first step of epitaxial lateral overgrowth with two steps.
Figure 2:
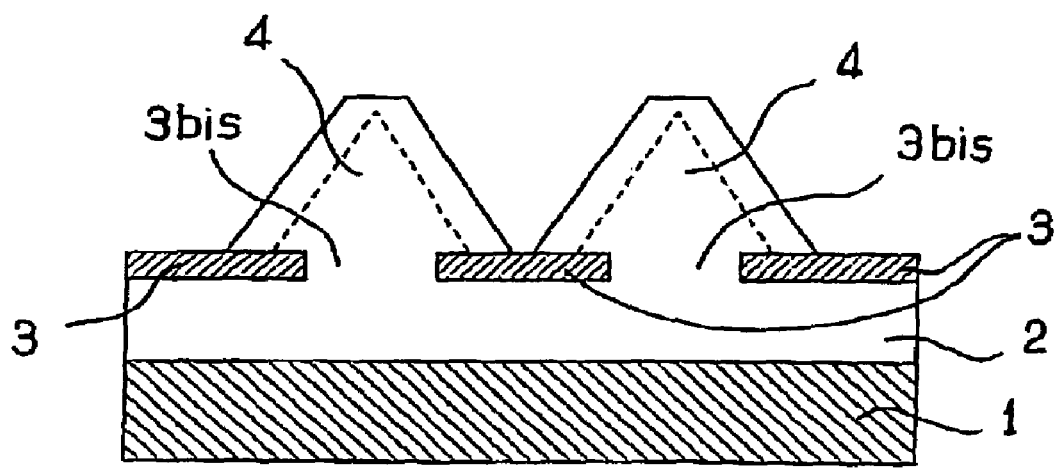
FIG. 2 is a representation of a second step of this epitaxial lateral overgrowth.

The first step is shown schematically by FIGS. 1 and 2: after having epitaxiated a layer of GaN, referenced 2, on a sapphire substrate, referenced 1, a deposition of SiN is carried out in situ (masks 3) and then, on this dielectric layer, openings 3bis are etched by photolithography in well-defined crystallographic directions [1-100] or [11-20] GaN. Finally, the growth is resumed, which first of all gives a selective epitaxy 4.

At the end of this first phase, where the speed of growth on an axis C, orthogonal to the principal plane of the substrate, is greater than the lateral growth speed, strips are obtained with triangular cross-sections with facets {11-22}. Inside these strips with a triangular cross-section, the through dislocations have been curved at 90°. In this first ELO epitaxy phase, a lateral overgrowth is then carried out in order finally to end up with an ELO flat layer 5. At the end of this step of the method a layer of GaN is obtained having a dislocation density of less than $10^7$ $cm^2$.

This assembly, formed by an ELO GaN layer 5 and the sapphire substrate 1, is implanted with $H^+$ ions (FIG. 3) so that a weak area 6 is created in the ELO layer 5 at a depth of between 50 nm and 5 μm. The ions are implanted at doses of between $1 \times 10^{15}$ and $1 \times 10^{17}$ $cm^{-2}$.

During the resumption of epitaxy carried out next on this ELO layer, at high temperature, the implanted area results in a weakening of the substrate consisting of the ELO layer in the cutting area. The ELO layer 5 therefore constitutes a favoured cutting area.

This layer weakened by the $H^+$ implantation, is then reworked by HVPE epitaxy. More precisely, after implantation, the weakened but complete ELO structure is placed on the substrate carrier of an HVPE reactor. From 10 to 500 μm of GaN is deposited in order to form a layer 7 (FIG. 4).

HVPE technology is very widely documented and the HVPE epitaxy reworking takes place here according to the prior art.

During the resumption of epitaxy of GaN by HVPE on this H implanted ELO structure 5, three main interesting effects are obtained.

A first effect is that the ELO layer 5 is thick without losing its crystalline qualities (neither new dislocation not crack is generated).

A second effect is that the dislocation density is reduced further during the resumption of HVPE epitaxy, by a factor of at least 2.

A third effect is that the total layer 5, 7 thus obtained separates spontaneously from its initial sapphire substrate 1 during a thermal cycle which, because of the difference in coefficients of thermal expansions of the sapphire 1 and the GaN layers 5, 6, gives rise to stresses, and in this way a self-supported GaN film 8 of ELO quality is obtained.

This self-supported GaN film has a surface where, as is normal in HVPE, protrusions are observed in the form of hexagonal pyramids, and, on a rear face, consisting of the fracture area, it is in fact possible to identify geometrical patterns corresponding to the starting ELO structure.

In this way a self-supported GaN film of ELO quality has been obtained, that is to say with a dislocation density of less than $10^7$ cm$^{-2}$.

Figure 6:
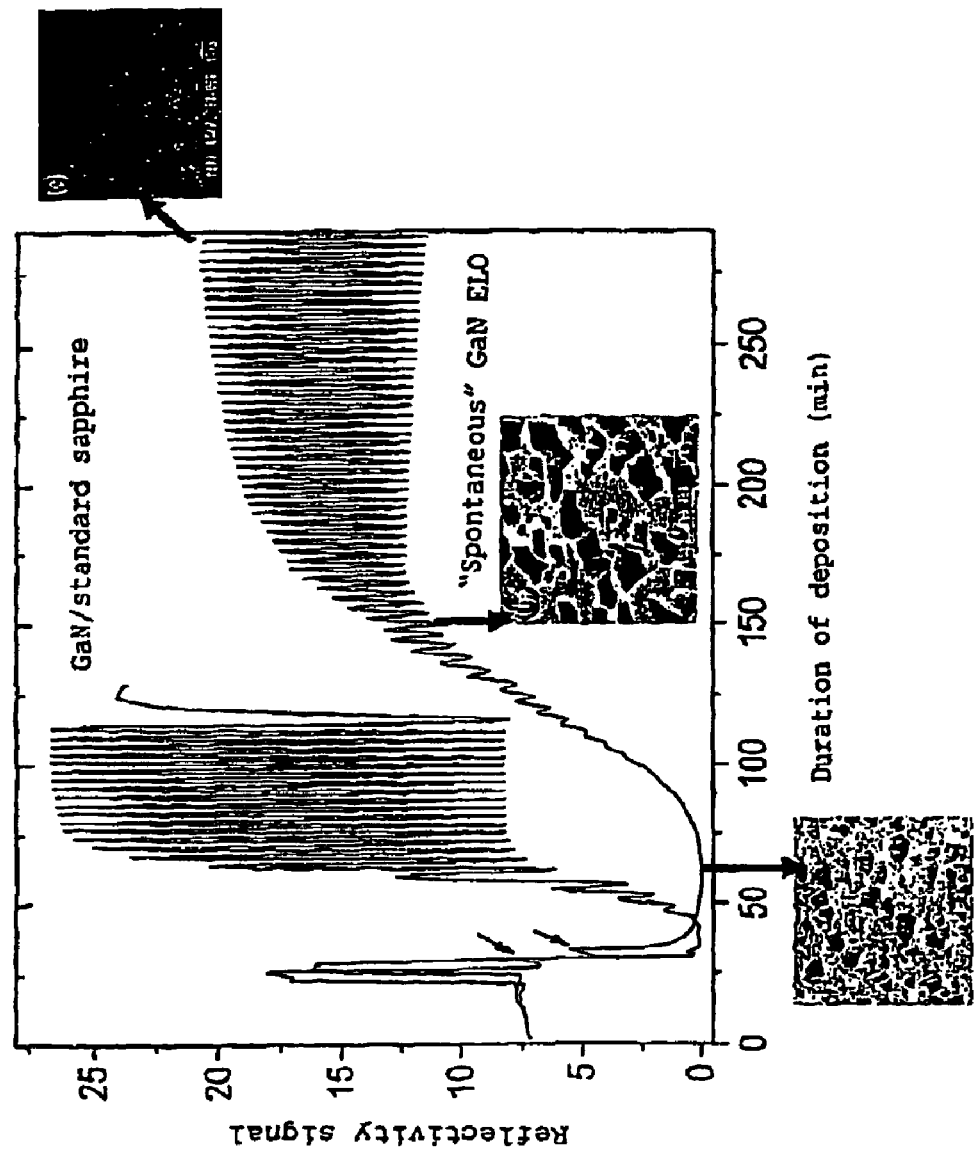
FIG. 6 is a representation of the successive steps being monitored by reflectometry of a reflectivity curve, and a representation of the implementation being carried out at various stages of the growth.

FIG. 6 presents the reflectivity curve measured in situ in real time during the "spontaneous ELO" growth during step (i). Photographs (a), (b) and (c) are scanning electron microscopy images of the GaN islands going from their spontaneous formation to their coalescence. This particular embodiment is illustrated by Example 2 below.

The films of GaN obtained according to the method of the present invention can be polished and used as high-quality films for the manufacture of components based on GaN (electronic or optoelectronic, such as laser diodes, light-emitting diodes, photodetectors, transistors, etc).

Other advantages of the present technology compared with the prior art are that it makes it possible to reuse the starting substrate several times after separation of the HVPE part and repolishing, and that it makes it possible to separate, for example by H$^+$ ion implantation in the self-supported GaN, very thin membranes, whose thickness may be between 5 nm and 50 nm of GaN, and to then attach them to an inexpensive substrate (such as ceramic AlN).

Thus another object of the invention is the substrate after separation from the layer of gallium nitride by ion implantation, comprising a part of the GaN directly deposited on the substrate during step (i) of the method according to the invention, by way of a new substrate able to be used for reworking by GaN epitaxy.

The use of the substrate after separation of the layer of gallium nitride by ion implantation, comprising part of the GaN directly deposited on the substrate during step (i) of the method according to the present invention, by way of new substrate for a reworking by GaN epitaxy, also forms part of the invention.

Having available self-supported films of GaN has considerable interest for the manufacture of laser diodes.

This is because the use of self-supported GaN rather than ELO GaN/sapphire (or SiC) makes it possible to produce laser components with front face and rear face contact, and in particular facilitates the cutting of the facets in order to produce a Fabry-Pérot cavity.

EXAMPLE 1

Step (i) According to the First Alternative

A horizontal or vertical reactor is used for the EVPOM epitaxy. In the example described a vertical reactor is used, with a cylindrical growth chamber 55 mm in diameter in order to receive a 2" substrate.

Step (i)

A layer of GaN is deposited by EPVOM on a sapphire substrate with a thickness of 250 µm to 430 µm using a special procedure which makes it possible to obtain islands spontaneously by a treatment consisting of covering the substrate with a film of silicon nitride whose thickness is around 0.1 nm. Explicitly, a substrate, in particular made from sapphire, is raised to a temperature of approximately 1050°-1120° C. in order to be nitrided by exposure to a flow of NH$_3$ for approximately 10 minutes.

Deposition of a Nucleation Layer

After this nitriding step, a very thin film of silicon nitride is formed on the surface, the film being obtained by reaction between NH$_3$ and silane SiH$_4$ for a sufficiently long time to limit the thickness of the film to that of one atomic plane. The operating conditions are as follows:

The gaseous vehicle is a mixture of nitrogen and hydrogen in equal proportions (4 sl/min). Ammonia is introduced at a flow rate of 2 sl/min whilst the silane, in dilute form at 50 ppm in hydrogen, 'is introduced at a ' flow rate of 50 scc/min. Under these conditions the typical duration of reaction between NH$_3$ and SiH$_4$ is around 30 seconds. These successive steps are monitored by laser reflectometry.

After completion of the layer of silicon nitride, a layer of gallium nitride with a thickness of 20 to 30 nm is deposited on the dielectric film. The gallium precursor is trimethylgallium (TMGa). The deposition layer is made at low temperature, at around 600° C.

After completion of the deposition of the layer of GaN, annealing at a high temperature of around 1080° C. is carried out. Under the conjoint effect of the rise in temperature, the presence in the gaseous vehicle of a sufficient quantity of hydrogen and the presence of the very thin film of silicon nitride under the layer of GaN, the morphology of the said layer undergoes a profound modification resulting from a recrystallisation in solid phase by mass transport. When the temperature approaches 1060° C., it is noted that the reflectivity of the buffer layer decreases suddenly: the buffer layer, initially continuous, is then converted into a discontinuous layer formed by islands of gallium nitride. At the end of this spontaneous in situ recrystallisation process, patterns or islands of GaN of very good crystalline quality and preserving an epitaxy relationship with the substrate by virtue of the very low thickness of the layer of silicon nitride are obtained. The patterns or islands of GaN are isolated from each other by areas where the layer of silicon nitride is bared. The characteristic heights of the islands are around 240 nm.

During the subsequent epitaxy reworking with gallium nitride on the surface of the sample, the areas where the layer of silicon nitride is bared function as a mask for the ELO, and the patterns or islands of GaN thus formed spontaneously are similar to isolated ELO patterns.

Deposition of a Thin Layer of Undoped Gallium Nitride Prior to the ELO Step

After the deposition of the nucleation layer, a thin layer of GaN with a thickness of 2 µm is deposited by organometallic pyrolysis vapour phase epitaxy. The source of gallium is trimethylgallium (TMGa) and the source of nitrogen is ammonia. Such a method is described in many documents.

Deposition of a Layer of ELO GaN (Use of a Dielectric Mask)

After the growth of the thin layer of gallium nitride described above, a fine layer of silicon nitride is deposited as a dielectric mask using SiH$_4$ and NH$_3$ with rates of 50 sccm and 2 slm respectively. Although extremely fine, this layer of SiN has proved to be a perfectly selective mask. Etching by photolithography and reactive ion attack is then carried out in order to produce 3 µm linear openings spaced apart by 7 µm. The linear openings are advantageously oriented in the direction [10-10] of GaN, although the variant of the method described in this example can be conducted for other linear orientations, in particular [11-20].

The epitaxy reworking on the cleared areas is effected with GaN not intentionally doped under operating conditions such that the rate of growth and direction [0001] of the patterns sufficiently exceeds the speed of growth in the direction normal to the inclined flanks of the said patterns. Under such conditions, the anisotropy of growth results in the disappearance of the facet (0001). The first time of implementing the ELO method ends when the disappearance of the facet (0001) of the pattern GaN is ensured. At the end of the first time, the GaN patterns have taken the form of strips whose cross-section is triangular.

The second time of the ELO consists of the epitaxy reworking by modifying the growth conditions in order to change the anisotropy of growth so that it becomes favourable to the flattening of the GaN patterns. As described in WO 99/20816, this can be obtained either by adding magnesium in the vapour phase or by increasing the temperature. During this second time, the GaN patterns develop with an expansion of the facet (0001) (which reappears at the top of each pattern) whilst the surface of the lateral facets decreases. The second time ends when the flanks have disappeared, the top surface of the deposition formed by the coalesced patterns is planar. This structure is implanted with $H^+$ ions in a step (ii) and reworked in HVPE as follows:

Step (iii): HVPE Reworking of the Implanted ELO Layer

After having undergone an implantation of hydrogen atoms in doses of between $1 \times 10^{15}$ and $1 \times 10^{17}$ cm$^{-2}$, the ELO layer is reused as a substrate and placed in an HVPE reactor in order to obtain a thickness of GaN sufficient to produce the spontaneous separation effect.

The rise in temperature takes place in a mixed atmosphere of nitrogen (2.5 μm) and ammonia (0.5 slm). As soon as a temperature of 1030° C. is reached, the vapour phase is modified, a mixture of 0.5 slm nitrogen and 2 slm hydrogen is maintained as a new carrier gas, whilst the ammonia flow rate is reduced to 0.4 slm.

The first phase of the growth of a thick layer of GaN is then initiated by introducing into the vapour phase a flow of 15 sccm of gallium chloride obtained by reacting 15 sccm of HCl with liquid gallium maintained at a temperature equal to that of the substrate (1030° C.). As soon as the gallium chloride is put in contact with the ammonia, there is an instantaneous formation of GaN, which is deposited on the substrate at a growth rate of approximately 40 μm per hour with these flow rates.

It is necessary to obtain a film of GaN which is sufficiently thick, and therefore sufficiently strong from the mechanical point of view, for the subsequent separation to involve the entire treated surface and therefore to avoid fracture of the layer of GaN into pieces with a small surface area. The growth thus continues for several hours under these experimental conditions in order to reach a thickness of at least 200 μm of the layer of GaN.

The growth is then interrupted and, whilst remaining under a flow of ammonia, the experimental parameters are modified in order to reduce the roughness of the surface, which is very great under the operating conditions described above. The growth temperature is raised to 1050° C., the flow of ammonia is increased to 1 slm and the composition of the carrier gas is modified in order to have a mixture of 1 slm hydrogen and 1.5 slm nitrogen.

As soon as the temperature of the substrate reaches 1050° C., the growth is then resumed, introducing a flow rate of 5 sccm of HCl on the liquid gallium, leading to a flow rate of 5 sccm of gallium chloride in the vapour phase. The growth is continued under these new conditions for approximately 2 hours.

The growth is then definitively ended by diverting the flow of HCl to the outside and cooling takes place in an atmosphere consisting solely of nitrogen and ammonia with a temperature ramp of 2.5° C. per minute. When the temperature of the substrate is below 800° C., the flow of ammonia can be interrupted completely.

The separation step (iv) takes place spontaneously by cooling.

EXAMPLE 2

Step (i) According to the Second Alternative

In Example 2, a 3×2" vertical reactor is used where the active gases are distributed by a shower system which separates the gaseous flows of ammonia and trimethylgallium.

Explicitly, a substrate, as described in MRS Internet J. Nitride Semicond. Res. 7, 8 (2002), in particular made from sapphire, is raised to a temperature of approximately 1050°-1120° C. in order to be nitrided by exposure to a flow of $NH_3$ for approximately 10 minutes.

Step (i): Thin Layer of GaN by Spontaneous ELO

After this nitriding step, a thin film of silicon nitride is formed on the surface, the film being obtained by reaction by $NH_3$ and silane $SiH_4$ for a sufficiently long time to limit the thickness of the film to a few atomic planes. The operating conditions are as follows:

The gaseous vehicle is a mixture of nitrogen and hydrogen in equal proportions (10 sl/min). The ammonia is introduced at a rate of 8 sl/min whilst the silane, in dilute form at 1000 ppm in hydrogen, is introduced at a rate of 50 scc/min. Under these conditions the typical duration of reaction between $NH_3$ and $SiH_4$ is around 300 seconds. The growth technology is then identical to Example 1:

Deposition of a layer of GaN at 600° C.

Annealing at 1080° C. (formation of islands).

The successive steps are monitored by laser reflectometry (FIG. 6). FIG. 6 also shows the reflectivity curve corresponding to Example 1. The longer duration of the deposition of silicon nitride (360 seconds compared with 30 seconds during the deposition of a nucleation layer as in Example 1) causes a much longer total coalescence of all the islands (that is to say which lasts longer ? further information ?), but produces a substrate GaN of better quality, typically with dislocation densities of less than $10^8$ cm$^{-2}$.

It is this substrate, produced according to this technology identified as "spontaneous ELO", which will then be implanted during a step (ii) (no further ELO structure is produced by deposition of a mask, opening in this mask and resumption of growth).

Step (iii): HVPE Reworking of the Implanted "Spontaneous ELO" Layer

After having undergone hydrogen ion implantation in doses of between $1 \times 10^{15}$ and $1 \times 10^{17}$ cm$^{-2}$, the "spontaneous ELO" layer is reused as a substrate and placed in an HVPE reactor in order to obtain a sufficient GaN thickness to produce the spontaneous separation effect. Unlike Example 1, the implantation can be carried out at various stages of the growth, either in the islands, or at an intermediate stage where the islands are not entirely coalesced, or after total coalescence. These three possibilities are indicated by an arrow in FIG. 6.

The resumption of epitaxy takes place in a 1×2" horizontal HVPE reactor. The temperature rise takes place in a mixed atmosphere of nitrogen (2.5 slm) and ammonia (0.5 slm). As soon as a temperature of 1030° C. is reached, the vapour phase is modified, a mixture of 0.5 slm of nitrogen and 2 slm of hydrogen is maintained as a new carrier gas, whilst the flow of ammonia is reduced to 0.4 slm.

The first phase of the growth of a thick layer of GaN is then initiated by introducing into the vapour phase a flow of 15 sccm of gallium chloride obtained by the reaction of 15 sccm of HCl with liquid gallium maintained at a temperature equal to that of the substrate (1030° C.). As soon as the gallium chloride is put in contact with the ammonia, there is an instantaneous formation of GaN which is deposited on the substrate with a growth rate of approximately 40 µm per hour with these flow rates.

It is necessary to obtain a film of GaN which is sufficiently thick and therefore sufficiently strong from a mechanical point of view for the subsequent separation to involve the entire treated surface and therefore to avoid the fracture of the layer of GaN into pieces with a small surface area. The growth thus continues for several hours under these experimental conditions in order to reach a thickness of the layer of GaN of at least 200 µm.

The growth is then interrupted and, whilst remaining under an ammonia flow, the experimental parameters are modified in order to reduce the roughness of the surface, which is very great under the operating conditions described above. The growth temperature is raised to 1050° C., the flow of ammonia is increased up to 1 slm and the composition of the carrier gas is modified so as to have a mixture of 1 slm of hydrogen and 1.5 slm of nitrogen.

As soon as the temperature of the substrate reaches 1050° C., the growth is then resumed by introducing a flow of 5 sccm of HCl onto the gallium liquid, resulting in a flow of 5 sccm of gallium chloride in the vapour phase. The growth is continued under these new conditions for approximately 2 hours.

The growth is then definitively completed by bypassing the flow of HCl to the outside and cooling takes place in an atmosphere consisting solely of nitrogen and ammonia with a temperature ramp of 2.5° C. per minute. When the temperature of the substrate is below 800° C. it is possible to interrupt the flow of ammonia completely.

The self-supported substrate which is separated spontaneously during a step (iv) after the thermal cycle, resumption of HVPE growth and cooling has a density of dislocations of less than $10^7$ cm$^{-2}$.

The invention claimed is:

1. A method of producing a self-supported film of gallium nitride (GaN) using a substrate, by deposition of GaN by epitaxy, the method comprising the following successive steps:
    (i) depositing a layer of GaN on a substrate by vapour or liquid phase epitaxy,
    (ii) a weakening ion implantation step so as to create a weak area in the layer of GaN deposited during the previous step,
    (iii) a step of reworking by epitaxial lateral overgrowth (ELO) in order to form a new layer of GaN, and
    (iv) a spontaneous separation step at the weak area to obtain the self-supported film of gallium nitride, wherein the spontaneous separation at the weak area is implemented by return to ambient temperature after the resumption of epitaxy.

2. A method according to claim 1, wherein the deposition of GaN during step (i) is effected by epitaxy by vapour or liquid phase epitaxial lateral overgrowth ELO.

3. A method according to claim 2, wherein step (i) is implemented by vapour phase epitaxy technology using halides and hydrides (HyPE), by organometallic pyrolysis vapour phase epitaxy (EPVOM) technology or by sublimation (CSVT).

4. A method according to claim 2, wherein step (i) comprises the following steps:
    deposition of a layer of GaN,
    deposition of a dielectric layer which is etched in order to obtain openings,
    deposition of GaN in the areas of GaN located in the openings, and then
    deposition of GaN giving rise to a lateral overgrowth until the patterns of GaN coalesce.

5. A method according to claim 2, wherein step (i) is a step of spontaneous ELO which comprises the following steps:
    deposition of silicon nitride to a thickness of around 10 to 20 nm,
    deposition of a continuous buffer layer of GaN, annealing at a high temperature of between 1050° and 1120°C. so that the buffer layer converts from a continuous layer to a discontinuous layer formed from patterns of GaN in the form of islands, and then
    deposition by epitaxy of GaN.

6. A method according to claim 5, wherein the implantation is effected either in the islands, or at an intermediate stage where the islands are not entirely coalesced, or after total coalescent of these islands.

7. A method according to claim 1, wherein the implantation ions can be chosen from amongst H$^+$, ions of rare gas such as helium, neon or krypton, as well as boron.

8. A method according to claim 1, wherein the implantation energies can vary from 80 to 160 kev.

9. A method according to claim 1, wherein the ions implanted in the layer of GaN are H$^+$ ions.

10. A method according to claim 1, wherein the implantation ions are H$^+$ ions and the H$^+$ ion implantation dose varies from $10^{16}$ to $10^{17}$ cm$^{-2}$.

11. A method according to claim 1, wherein the depth of implantation varies from 50 nm up to the GaN/initial substrate interface.

12. A method according to claim 1, wherein the substrate is chosen from amongst sapphire, ZnO, 6H—SiC, LiAlO$_2$, LiAlO$_2$, LiGaO$_2$, MgAlO$_2$, Si, GaAs, AlN or GaN.

13. A method according to claim 12, wherein the substrate is a sapphire substrate.

14. A method according to claim 1, wherein the epitaxial lateral overgrowth according to step (iii) as defined in claim 2 is performed by EPVOM, HVPE or CSVT epitaxy or liquid phase epitaxy (LPE).

15. A method according to claim 1, wherein the gallium nitride is doped during at least one of the epitaxial lateral overgrowth steps by means of a doping substance which may be chosen from amongst magnesium, zinc, beryllium, calcium, carbon, boron or silicon.

* * * * *

UNITED STATES PATENT AND TRADEMARK OFFICE
CERTIFICATE OF CORRECTION

PATENT NO. : 7,488,385 B2 Page 1 of 1
APPLICATION NO. : 10/516358
DATED : February 10, 2009
INVENTOR(S) : Lahreche et al.

It is certified that error appears in the above-identified patent and that said Letters Patent is hereby corrected as shown below:

In Column 12, Claim 3, line 6, please delete "HyPE" and insert -- HVPE --.
In Column 12, Claim 12, line 48, please delete "$LiAlO_2$".

Signed and Sealed this

Twelfth Day of May, 2009

JOHN DOLL
*Acting Director of the United States Patent and Trademark Office*